US009236473B2

(12) United States Patent
Meade et al.

(10) Patent No.: US 9,236,473 B2
(45) Date of Patent: *Jan. 12, 2016

(54) FIELD EFFECT TRANSISTOR DEVICES

(71) Applicant: Micron Technology, Inc., Boise, ID (US)

(72) Inventors: Roy E. Meade, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/277,134

(22) Filed: May 14, 2014

(65) Prior Publication Data
US 2014/0246671 A1  Sep. 4, 2014

Related U.S. Application Data

(63) Continuation of application No. 13/858,141, filed on Apr. 8, 2013, now Pat. No. 8,867,261, which is a continuation of application No. 12/705,928, filed on Feb. 15, 2010, now Pat. No. 8,437,174.

(51) Int. Cl.
*G11C 11/22* (2006.01)
*H01L 29/78* (2006.01)
(Continued)

(52) U.S. Cl.
CPC .......... *H01L 29/7841* (2013.01); *G11C 11/565* (2013.01); *G11C 13/0002* (2013.01);
(Continued)

(58) Field of Classification Search
CPC .................................. G11C 11/22; G11C 11/24
USPC .................................................. 365/149, 145
See application file for complete search history.

(56) References Cited

U.S. PATENT DOCUMENTS 4,094,008 A    6/1978   Lockwood
4,242,736 A   12/1980   Raffel et al.
(Continued)

FOREIGN PATENT DOCUMENTS

CN    1345069      4/2002
CN    101053039   10/2007
(Continued)

OTHER PUBLICATIONS

U.S. Appl. No. 12/705,918, filed Feb. 15, 2010, Meade.
(Continued)

*Primary Examiner* — Michael Tran
(74) *Attorney, Agent, or Firm* — Wells St. John, P.S.

(57) ABSTRACT

A memcapacitor device includes a pair of opposing conductive electrodes. A semiconductive material including mobile dopants within a dielectric and a mobile dopant barrier dielectric material are received between the pair of opposing conductive electrodes. The semiconductive material and the barrier dielectric material are of different composition relative one another which is at least characterized by at least one different atomic element. One of the semiconductive material and the barrier dielectric material is closer to one of the pair of electrodes than is the other of the semiconductive material and the barrier dielectric material. The other of the semiconductive material and the barrier dielectric material is closer to the other of the pair of electrodes than is the one of the semiconductive material and the barrier dielectric material. Other implementations are disclosed, including field effect transistors, memory arrays, and methods.

17 Claims, 7 Drawing Sheets

(51) Int. Cl.
   *G11C 11/56* (2006.01)
   *G11C 13/00* (2006.01)
   *H01L 21/28* (2006.01)
   *H01L 49/02* (2006.01)
   *H01L 29/792* (2006.01)
   *H01L 27/06* (2006.01)

(52) U.S. Cl.
   CPC ........ *G11C13/0007* (2013.01); *G11C 13/0069* (2013.01); *H01L 21/28273* (2013.01); *H01L 21/28282* (2013.01); *H01L 27/0629* (2013.01); *H01L 28/40* (2013.01); *H01L 29/792* (2013.01); *G11C 2213/51* (2013.01); *G11C 2213/53* (2013.01); *G11C 2213/77* (2013.01)

(56) References Cited

U.S. PATENT DOCUMENTS

| | | | |
|---|---|---|---|
| 4,947,376 | A | 8/1990 | Arimoto et al. |
| 5,161,121 | A | 11/1992 | Cho |
| 5,736,420 | A | 4/1998 | Min et al. |
| 5,917,744 | A | 6/1999 | Kirihata et al. |
| 6,317,375 | B1 | 11/2001 | Perner |
| 6,380,056 | B1 | 4/2002 | Shue et al. |
| 6,438,022 | B2* | 8/2002 | Schlosser et al. ............ 365/145 |
| 6,518,589 | B2 | 2/2003 | King |
| 6,559,470 | B2 | 5/2003 | Tsu-Jae |
| 6,657,882 | B2 | 12/2003 | Takashima |
| 6,670,659 | B1 | 12/2003 | Gudesen et al. |
| 6,864,529 | B2 | 3/2005 | Mei et al. |
| 6,887,792 | B2 | 5/2005 | Perlov et al. |
| 6,999,854 | B2 | 2/2006 | Roth |
| 7,009,278 | B2 | 3/2006 | Hsu |
| 7,031,180 | B2* | 4/2006 | Karasawa et al. ............ 365/145 |
| 7,037,731 | B2 | 5/2006 | Kijima et al. |
| 7,102,914 | B2* | 9/2006 | Chen et al. .................... 365/149 |
| 7,110,281 | B1* | 9/2006 | Voogel et al. ................. 365/149 |
| 7,161,838 | B2 | 1/2007 | Mei et al. |
| 7,177,135 | B2* | 2/2007 | Kim et al. ................. 361/301.2 |
| 7,255,941 | B2 | 8/2007 | Kijima et al. |
| 7,302,513 | B2 | 11/2007 | Mouttet |
| 7,327,596 | B2* | 2/2008 | Ebihara et al. ................ 365/149 |
| 7,342,413 | B2 | 3/2008 | Mouttet |
| 7,365,382 | B2 | 4/2008 | Willer et al. |
| 7,371,473 | B2 | 5/2008 | Kijima et al. |
| 7,378,870 | B2 | 5/2008 | Mouttet |
| 7,391,235 | B2 | 6/2008 | Mouttet |
| 7,426,128 | B2 | 9/2008 | Scheuerlein |
| 7,435,648 | B2 | 10/2008 | Hsu et al. |
| 7,443,710 | B2 | 10/2008 | Fang et al. |
| 7,447,828 | B2 | 11/2008 | Mouttet |
| 7,449,354 | B2 | 11/2008 | Marchant et al. |
| 7,459,933 | B2 | 12/2008 | Mouttet |
| 7,482,223 | B2 | 1/2009 | Hlgashitani et al. |
| 7,564,262 | B2 | 7/2009 | Mouttet |
| 7,576,565 | B2 | 8/2009 | Mouttet |
| 7,592,659 | B2 | 9/2009 | Isogai |
| 7,609,086 | B2 | 10/2009 | Mouttet |
| 7,626,878 | B1 | 12/2009 | Lin et al. |
| 7,696,506 | B2 | 4/2010 | Lung |
| 7,723,771 | B2 | 5/2010 | Boescke et al. |
| 7,755,424 | B2 | 7/2010 | Mouttet |
| 7,763,880 | B2 | 7/2010 | Williams |
| 7,778,082 | B2 | 8/2010 | Shin et al. |
| 7,812,404 | B2 | 10/2010 | Herner et al. |
| 7,902,867 | B2 | 3/2011 | Mouttet |
| 7,965,539 | B2 | 6/2011 | Osano et al. |
| 7,983,065 | B2 | 7/2011 | Samachisa |
| 8,183,553 | B2 | 5/2012 | Phatak et al. |
| 8,199,556 | B2 | 6/2012 | Srinivasan et al. |
| 8,223,539 | B2 | 7/2012 | Smythe et al. |
| 8,249,838 | B2 | 8/2012 | Pino et al. |
| 8,259,489 | B2 | 9/2012 | Nagashima et al. |
| 8,294,219 | B2 | 10/2012 | Malhotra et al. |
| 8,405,124 | B2 | 3/2013 | Karg et al. |
| 8,416,609 | B2 | 4/2013 | Meade |
| 8,437,174 | B2 | 5/2013 | Meade et al. |
| 8,547,727 | B2 | 10/2013 | Wu et al. |
| 8,575,585 | B2 | 11/2013 | Yang et al. |
| 8,634,224 | B2 | 1/2014 | Srinivasan et al. |
| 8,867,261 | B2 | 10/2014 | Meade et al. |
| 8,872,246 | B1 | 10/2014 | Stevens et al. |
| 9,040,948 | B2 | 5/2015 | Ribeiro et al. |
| 2001/0019147 | A1 | 9/2001 | De Boer et al. |
| 2002/0034101 | A1 | 3/2002 | Semi |
| 2002/0084480 | A1 | 7/2002 | Basceri et al. |
| 2003/0045037 | A1 | 3/2003 | Mei et al. |
| 2003/0179617 | A1 | 9/2003 | Gudesen et al. |
| 2004/0022090 | A1 | 2/2004 | Hasegawa et al. |
| 2004/0065912 | A1 | 4/2004 | Liu et al. |
| 2004/0214352 | A1 | 10/2004 | Kijima et al. |
| 2004/0218441 | A1 | 11/2004 | Schwarzl |
| 2004/0229384 | A1 | 11/2004 | Kijima et al. |
| 2004/0246768 | A1 | 12/2004 | Krieger et al. |
| 2005/0157547 | A1 | 7/2005 | Mei et al. |
| 2006/0022325 | A1 | 2/2006 | Hwang et al. |
| 2006/0083933 | A1 | 4/2006 | Kijima et al. |
| 2006/0088731 | A1 | 4/2006 | Kijima et al. |
| 2006/0097288 | A1 | 5/2006 | Baek et al. |
| 2006/0131627 | A1 | 6/2006 | Kondo et al. |
| 2006/0223251 | A1 | 10/2006 | Isogai |
| 2007/0117315 | A1 | 5/2007 | Lai et al. |
| 2007/0217252 | A1 | 9/2007 | Symanczyk |
| 2007/0229111 | A1 | 10/2007 | Mouttet |
| 2007/0229112 | A1 | 10/2007 | Mouttet |
| 2007/0229121 | A1 | 10/2007 | Mouttet |
| 2007/0231972 | A1 | 10/2007 | Mouttet |
| 2007/0241942 | A1 | 10/2007 | Mouttet |
| 2007/0257704 | A1 | 11/2007 | Mouttet |
| 2007/0267675 | A1 | 11/2007 | Cho et al. |
| 2008/0001172 | A1 | 1/2008 | Karg et al. |
| 2008/0048186 | A1 | 2/2008 | Cheng et al. |
| 2008/0059688 | A1 | 3/2008 | Mouttet |
| 2008/0079029 | A1 | 4/2008 | Williams |
| 2008/0090337 | A1 | 4/2008 | Williams |
| 2008/0172385 | A1 | 7/2008 | Mouttet |
| 2008/0212382 | A1 | 9/2008 | Mouttet |
| 2008/0222342 | A1 | 9/2008 | Mouttet |
| 2008/0246116 | A1 | 10/2008 | Mouttet |
| 2008/0278990 | A1 | 11/2008 | Kumar et al. |
| 2008/0307151 | A1 | 12/2008 | Mouttet |
| 2009/0020740 | A1 | 1/2009 | Chien et al. |
| 2009/0026435 | A1 | 1/2009 | Kakegawa |
| 2009/0122602 | A1 | 5/2009 | Takemura et al. |
| 2009/0163826 | A1 | 6/2009 | Mouttet |
| 2009/0207681 | A1 | 8/2009 | Juengling |
| 2009/0244953 | A1 | 10/2009 | Maejima |
| 2009/0279343 | A1 | 11/2009 | Chang et al. |
| 2010/0034010 | A1 | 2/2010 | Xi et al. |
| 2010/0078620 | A1 | 4/2010 | Xi et al. |
| 2010/0128512 | A1 | 5/2010 | Ohnishi et al. |
| 2010/0320547 | A1 | 12/2010 | Ando et al. |
| 2011/0051310 | A1 | 3/2011 | Strachan et al. |
| 2011/0186801 | A1 | 8/2011 | Yang et al. |
| 2011/0199814 | A1 | 8/2011 | Meade |
| 2011/0199815 | A1 | 8/2011 | Meade |
| 2011/0240941 | A1 | 10/2011 | Pickett et al. |
| 2011/0261606 | A1 | 10/2011 | Sandhu et al. |
| 2011/0266515 | A1 | 11/2011 | Pickett et al. |
| 2012/0012809 | A1 | 1/2012 | Yang et al. |
| 2012/0014170 | A1 | 1/2012 | Strukov et al. |
| 2012/0032134 | A1 | 2/2012 | Yang et al. |
| 2012/0063192 | A1 | 3/2012 | Lee |
| 2012/0104346 | A1 | 5/2012 | Yi et al. |
| 2012/0133026 | A1 | 5/2012 | Yang et al. |
| 2013/0001498 | A1 | 1/2013 | Srinivasan et al. |
| 2013/0002634 | A1 | 1/2013 | Wendler et al. |
| 2013/0082229 | A1 | 4/2013 | Chen |
| 2013/0223134 | A1 | 8/2013 | Yi et al. |

FOREIGN PATENT DOCUMENTS

| | | |
|---|---|---|
| CN | 101075629 | 11/2007 |
| CN | 101258600 | 9/2008 |

(56) References Cited

FOREIGN PATENT DOCUMENTS

| CN | 101300678 | 11/2008 |
|---|---|---|
| CN | 201180009631.4 | 4/2014 |
| CN | 201180039043.5 | 1/2015 |
| CN | 201180009465.8 | 3/2015 |
| EP | 11742625 | 6/2013 |
| EP | 11816751 | 7/2015 |
| JP | H03-004972 | 2/1991 |
| JP | H03-104285 | 5/1991 |
| JP | 2003-152118 | 5/2003 |
| JP | 2006-093736 | 4/2006 |
| JP | 2006-176366 | 7/2006 |
| JP | 2006-188427 | 7/2006 |
| JP | 2006-245280 | 9/2006 |
| JP | 2008-258623 | 10/2008 |
| JP | 4383523 | 12/2009 |
| TW | 200616086 | 5/2006 |
| TW | 200636929 | 10/2006 |
| TW | 200805376 | 1/2008 |
| TW | 200912932 | 3/2009 |
| TW | 100104805 | 4/2014 |
| TW | 100126468 | 10/2014 |
| TW | 102136626 | 5/2015 |
| WO | WO 2006/029228 | 3/2006 |
| WO | WO 2008/108822 | 9/2008 |
| WO | WO 2010/068221 | 6/2010 |
| WO | WO 2010/144092 | 12/2010 |
| WO | WO 2010/147588 | 12/2010 |
| WO | PCT/US2011/022390 | 9/2011 |
| WO | PCT/US2011/023190 | 10/2011 |
| WO | PCT/US2011/043504 | 12/2011 |
| WO | PCT/US2011/022390 | 8/2012 |
| WO | PCT/US2011/023190 | 8/2012 |
| WO | PCT/US2011/043504 | 2/2013 |

OTHER PUBLICATIONS

U.S. Appl. No. 12/705,928, filed Feb. 15, 2010, Meade et al.
An Introduction to memimpedance and Memadmittance Systems Analysis; http://knol.google.com/k/an-introduction-to-memimpedance-and-memadmittance-systems-analysis#; 2009; 21 pp.
Biolek et al., "SPICE Modeling of Memristive, Memcapacitative and Memiductive Systems", IEEE; 2009; pp. 249-252.
Chua et al., "Memristive Devices and System", Proceedings of the IEEE, vol. 64, No. 2, Feb. 1976; pp. 209-223.
Chua, "Memristor—The Missing Circuit Element", IEEE Transactions on Circuit Theory, vol. CT-18, No. 5; Sep. 1971; pp. 507-519.
Chua, "Nonlinear Circuit Foundations for Nanodevices, Part I: The Four-Element Torus", IEEE; 2003; pp. 1830-1859.
Di Ventra et al., "Circuit elements with memory: Memristors, Memcapacitors, and Meminductors" In: Proceedings of the IEEE, vol. 97, Issue 10, pp. 1717-1724, Oct. 2009.
Di Ventra et al., "Putting Memory Into Circuit Elements", Memristors, Memcapacitors and Meminductors; Aug. 2009; pp. 1371-1372.
Di Ventura et al., "Circuit elements with memory", Memristors, Memcapacitors and Meminductors; Jan. 23, 2009; pp. 1-6.
HP Memristor FAQ; http://www.hpl.hp.com/news/2008/apr-jun/memristorfaq_html; Apr. 2008; 3 pp.
Lai et al., "Analog memory capacitor based on field-configurable ion-doped polymers" In: Applied Physics Letters, vol. 95, Issue 21, pp. 213503-213503-3, Nov. 2009.
Liu et al., "Electric-pulse-induced Capacitance Change Effect in Perovskite Oxide Thin Films", Journal of Applied Physics, Sep. 2006, vol. 100,. Issue 5, p. 056101.
Meyer et al., "Oxide Dual-Layer Memory Element for Scalable Non-Volatile Cross-Point Memory Technology", IEEE; 2008; pp. 1-5.
Pershin et al., "Experimental Demonstration of Associative Memory with Memristive Neural Networks", Sep. 18, 2009; pp. 1-5.
Pershin et al., "Memristive Circuits Simulate Memcapacitors and Meminductors", Oct. 8, 2009; pp. 1-2.
Strukov et al., "Coupled Ionic and Electronic Transport Model of Thin-Film Semiconductor Memristive Behavior," Small 2009, 5, No. 9; pp. 1058-1063.
Strukov et al., "Exponential Ionic Drift: Fast Switching and Low Volatility of Thin-Film Memristors", Applied Physics A; Nov. 28, 2008; pp. 515-519.
Strukov et al., "The missing memristor found", vol. 453, Nature Publishing Group; May 1, 2008; pp. 80-83.
The Business Landscape for Memristor Electronics; http://knol.google.com/k/the-business-landscape-for-memristor-electronics#; 2009; 12 pp.
The Mysterious Memristor; http://spectrum.ieee.org/semiconductors/design/the-mysterious-memristor; May 2008; 4 pp.
Wakefield et al., "Titanium Dioxide as Gate Insulator for M.O.S. Transistors", Electronic Letters, vol. 6, No. 16; Aug. 6, 1970; pp. 507-508.
What is a Memristor?; http://www.coolestanswers.com/science-technology/what-is-a-memristor.html; Oct. 19, 2008; 2 pp.

* cited by examiner

FIELD EFFECT TRANSISTOR DEVICES

RELATED PATENT DATA

This patent resulted from a continuation application of U.S. patent application Ser. No. 13/858,141, filed Apr. 8, 2013, entitled "Memcapacitor Devices, Field Effect Transistor Devices, Non-Volatile Memory Arrays, and Methods Of Programming", naming Roy E. Meade and Gurtej S. Sandhu as inventors, now U.S. Pat. No. 8,867,261, which is from a continuation application of U.S. patent application Ser. No. 12/705,928, filed Feb. 15, 2010, now U.S. Pat. No. 8,437,174, entitled "Memcapacitor Devices, Field Effect Transistor Devices, Non-Volatile Memory Arrays, and Methods Of Programming", naming Roy E. Meade and Gurtej S. Sandhu as inventors, the disclosures of which are incorporated by reference.

TECHNICAL FIELD

Embodiments disclosed herein pertain to memcapacitor devices, to field effect transistor devices, to non-volatile memory arrays and to methods of programming.

BACKGROUND

Capacitors and field effect transistors are two types of electronic components used in integrated circuitry, for example in logic circuitry and memory circuitry. One property of a capacitor is its capacitance which is impacted by a number of variables such as size, construction, and materials of manufacture. One property of a field effect transistor is its threshold voltage. Such is a measure of the minimum gate voltage required for current to flow between a pair of source/drain regions through a channel region. Factors that impact threshold voltage also include size, construction and materials of manufacture.

Capacitors and transistors upon manufacture typically have fixed capacitance and fixed threshold voltage, respectively, as opposed to variable, adjustable, or programmable capacitance and threshold voltage.

DETAILED DESCRIPTION OF EXAMPLE EMBODIMENTS

Figure 1:
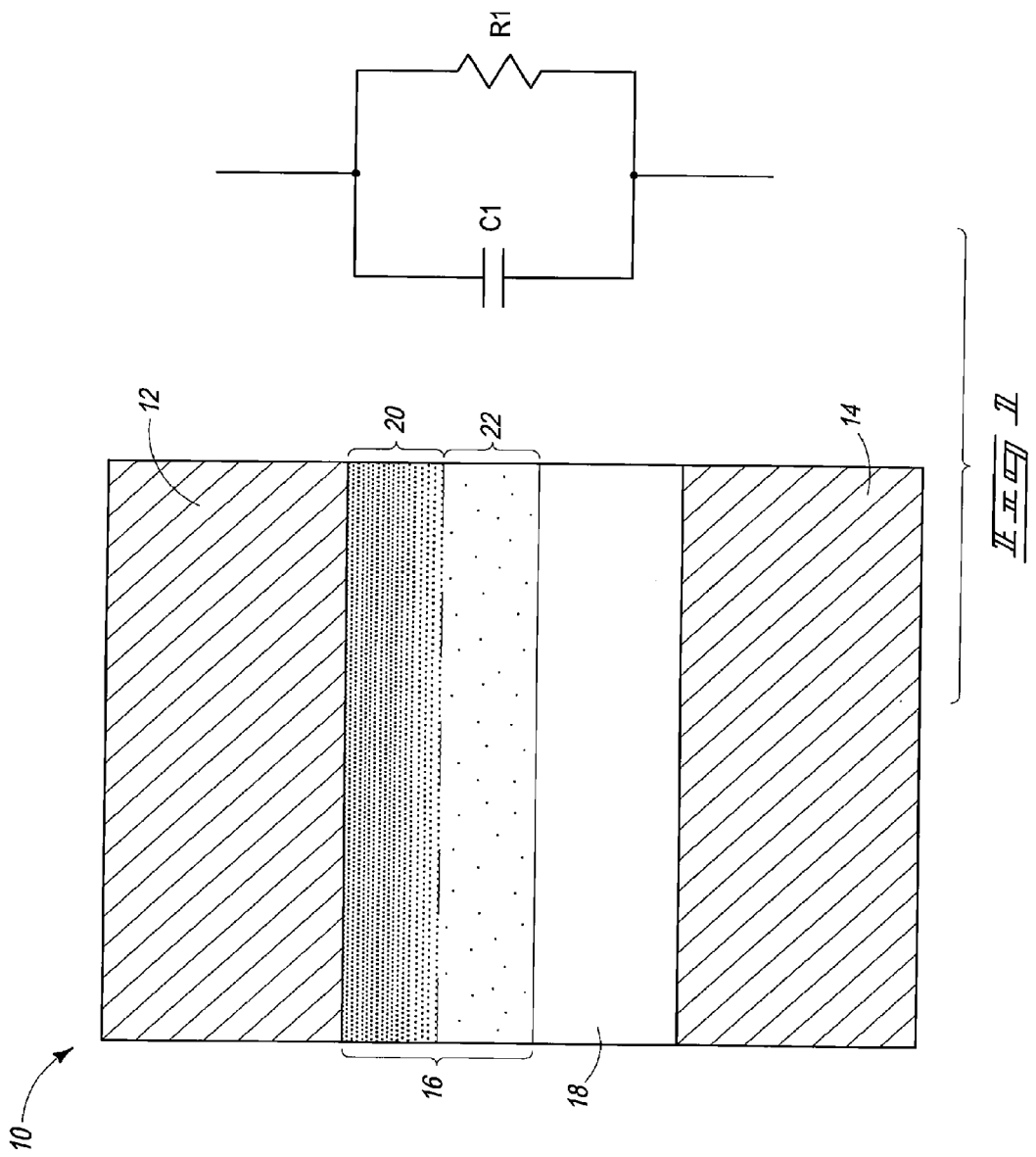
FIG. 1 is a diagrammatic sectional view of a memcapacitor device in one programmed state, and in accordance with an embodiment of the invention.
Figure 2:
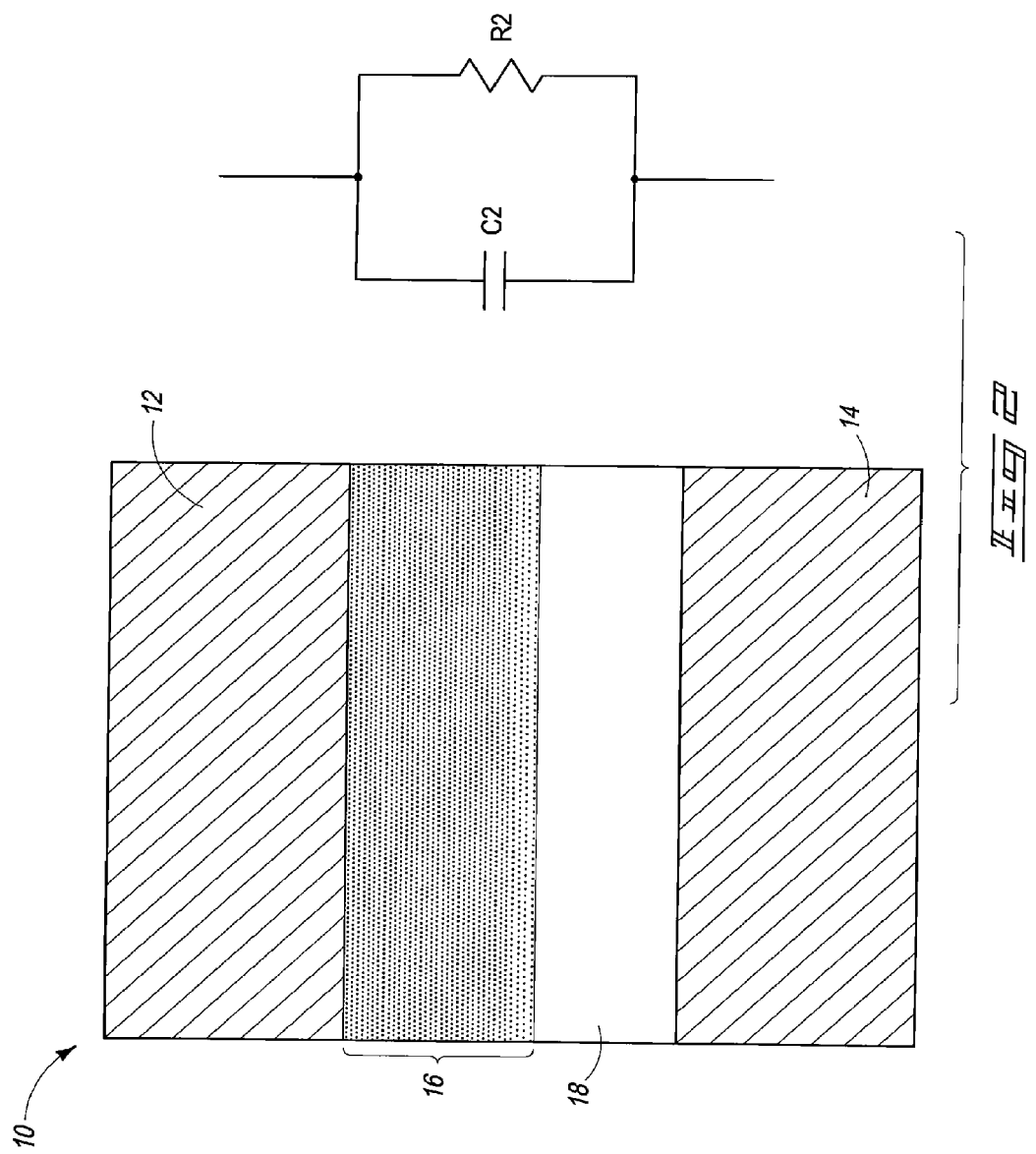
FIG. 2 is a view of the FIG. 1 memcapacitor device in another programmed state in accordance with an embodiment of the invention.

An example memcapacitor device 10 in accordance with an embodiment of the invention is shown in FIGS. 1 and 2. Such show memcapacitor device 10 in two different programmed states. Alternate and/or additional programmed states may be used.

Referring to FIG. 1, memcapacitor device 10 comprises a pair of opposing conductive electrodes 12 and 14. Such may be comprised of any suitable conductive material, for example elemental metals, alloys of elemental metals, conductive metal compounds, and/or conductively doped semiconductive materials. Electrodes 12 and 14 may be of the same or different thicknesses. An example thickness range is from 3 nanometers to 100 nanometers. Further, conductive electrodes 12 and 14 may be of the same or different composition relative to one another, and regardless may or may not be homogenous. In one example, such may consist essentially of elemental platinum.

At least two materials 16 and 18 are received between opposing conductive electrodes 12 and 14. Material 16 is a statically programmable semiconductive material which comprises mobile dopants that are received within a dielectric. It is statically programmable between at least two different states that are characterized by different capacitance values. At least one of the states includes localization or gathering of the mobile dopants such that a dielectric region is formed within material 16. More than two programmable states may be used.

In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. Mobile dopants of material 16 are depicted diagrammatically by dots/stippling in the drawings. Density of the dots/stippling in a given area/volume in the drawings indicates degree of mobile dopant density, with more dots/stippling indicating higher mobile dopant density and less dots/stippling indicating lower mobile dopant density. More than one type of mobile dopant may be used as part of material 16.

For material 16, example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$.

In one embodiment, material 16 that comprises oxygen vacancies as mobile dopants may comprise a combination of $TiO_2$ and $TiO_{2-x}$ in at least one programmed state depending on location of the oxygen vacancies and the quantity of the oxygen vacancies in the locations where such are received. In one embodiment, material 16 that comprises nitrogen vacancies as mobile dopants may comprise a combination of AlN and $AlN_{1-x}$ in at least one programmed state depending on location of the nitrogen vacancies and the quantity of the nitrogen vacancies in the locations where such are received. In one embodiment, material 16 that comprises fluorine vacancies as mobile dopants may comprise a combination of $MgF_2$ and $MgF_{2-x}$ in at least one programmed state depending on location of the fluorine vacancies and the quantity of the fluorine vacancies in the locations where such are received. In one embodiment, the mobile dopants comprise aluminum atom interstitials in a nitrogen-containing material.

Material 16 may be of any suitable thickness that may be dependent upon the composition of the dielectric, upon the composition of the mobile dopants, and/or upon the quantity of the mobile dopants in material 16. Example thicknesses include from 4 nanometers to 50 nanometers, and in one embodiment a thickness no greater than 120 nanometers.

Material 18 is a mobile dopant barrier dielectric material. Such may be homogenous or non-homogenous. Mobile dopant barrier dielectric material 18 is characterized or distinguished from the dielectric within material 16 by both being impervious to movement of mobile dopants to within material 18 and being impervious to location-changing-movement of any dopants inherently therein. Semiconductive material 16 and barrier dielectric material 18 may be of different composition relative to one another which is at least characterized by at least one different atomic element. In one embodiment, mobile dopant barrier dielectric material 18 comprises a metal oxide and the dielectric within which the mobile dopants are received in material 16 comprises another metal oxide, wherein a metal element of material 18 is different from a metal element of the dielectric of material 16. Regardless, example mobile dopant barrier dielectric materials include at least one of $ZrO_2$, $SiO_2$, $Si_3N_4$, GeN, and $SrTiO_3$. In one embodiment, the barrier dielectric material consists essentially of stoichiometric metal oxide, for example, either or a combination of $ZrO_2$ and $SrTiO_3$.

Material 16 and mobile dopant barrier dielectric material 18 may be of the same or different thicknesses relative one another. In one embodiment, mobile dopant barrier dielectric material 18 is no thicker than material 16, and in one embodiment as shown is thinner than material 16. In one embodiment, mobile dopant barrier dielectric material 18 has an equivalent oxide thickness from 1 nanometer to 7 nanometers, and in one embodiment has an equivalent oxide thickness no greater than 10 nanometers. In the context of this document, "equivalent oxide thickness" is a linear dimension of how thick undoped silicon dioxide would need to be to produce the same dielectric effect as the mobile dopant barrier dielectric material being used. Where the mobile dopant barrier dielectric material being used is undoped silicon dioxide or a material of equal permittivity to that of undoped silicon dioxide, the "equivalent oxide thickness" and the thickness of the mobile dopant barrier dielectric material being used would be the same.

One of semiconductive material 16 and barrier dielectric material 18 is closer to one of pair of electrodes 12, 14 than is the other of semiconductive material 16 and barrier dielectric material 18. Correspondingly, the other of the semiconductive material 16 and the barrier dielectric material 18 is closer to the other of pair of electrodes 12, 14. In the depicted embodiment, material 16 and mobile dopant barrier dielectric material 18 are in physical touching contact with one another. Further in the depicted embodiment, no other material is received between the pair of opposing conductive electrodes 12, 14 but for material 16 and mobile dopant barrier dielectric material 18.

FIGS. 1 and 2 depict memcapacitor device 10 in two different static programmed states. FIG. 2 diagrammatically depicts an example highest capacitance state and FIG. 1 depicts an example lowest capacitance state. For example and by way of example only, FIG. 1 depicts material 16 as comprising regions 20 and 22 which are characterized by respective different average concentration of mobile dopants. Region 22 diagrammatically shows a significantly lower quantity of mobile dopants therein such that region 22 is effectively a dielectric. Some quantity of mobile dopants greater than zero may be within region 22 as long as region 22 may function in a dielectric capacity. Regardless, region 20 has a suitable higher average concentration of mobile dopants than any concentration of such within region 22. Any mobile dopants received within either of region 20 or region 22 may or may not be homogenously distributed within the respective region 20 or 22. Regardless, region 20 is electrically conductive, thereby effectively providing a thicker conductive capacitor electrode by a combination of material 12 and region 20. On the other hand, region 22 is dielectric thereby adding to the effective dielectric thickness of mobile dopant barrier dielectric material 18.

Referring to FIG. 2, the mobile dopants are shown to be sufficiently received throughout all of material 16 such that the entire thickness thereof is essentially electrically conductive. Accordingly, one of the conductive capacitor electrodes effectively constitutes the combination of materials 12 and 16. Further, in such state, only mobile dopant barrier dielectric material 18 constitutes all of the dielectric thickness between conductive capacitor electrodes 12 and 14. Thereby, the programmed state of FIG. 2 has higher capacitance than that depicted in FIG. 1. Further considered or in other words, the capacitance in the FIG. 1 programmed state is lower than the capacitance in the FIG. 2 programmed state regardless of an amount of charge actually held by memcapacitor device 10 at any given moment in time. Whether memcapacitor device 10 is not charged, partially charged, or fully charged determines the charge state of memcapacitor device 10, but does not affect the capacitance of memcapacitor device 10. Thus, charge state, as used herein, refers to the amount of charge actually held by a capacitor at a given moment in time. Capacitance, as used herein, refers to a number of coulombs per volt that a capacitor is capable of holding regardless of the charge state of the capacitor.

The mobile dopants may or may not be homogenously distributed throughout material 16 in the FIG. 2 high capacitance state. Further and regardless, different selectable programmed capacitance states beyond or in addition to a highest and lowest capacitance states may be achieved. Regardless, memcapacitor device 10 is characterized at least in part by retaining its programmed capacitance state after the act which provided the programmed state is removed.

As a specific example capacitor device 10, conductive capacitor electrodes 12 and 14 each consist essentially of elemental platinum having a thickness of 5 nanometers. Mobile dopant barrier dielectric material 18 is $ZrO_2$ having a thickness of 3 nanometers. Semiconductive material 16 is a combination of $TiO_2$ and $TiO_{2-x}$ and has as an overall thickness of 4 nanometers. In FIG. 1, region 22 has a thickness of 2 nanometers and is $TiO_2$ that has sufficiently less than $5 \times 10^{18}$ oxygen vacancies/$cm^3$ which renders region 22 non-conductive. Region 20 has a thickness of 2 nanometers and an overall average oxygen vacancy density sufficiently greater than $5 \times 10^{18}$ vacancies/$cm^3$ which renders region 20 conductive. In FIG. 2, region 16 may be considered as $TiO_{2-x}$ having an overall average oxygen vacancy density sufficiently greater than $5 \times 10^{18}$ vacancies/$cm^3$ which is sufficient to render all of region 16 to be conductive. Overall average oxygen vacancy density in region 20 in FIG. 1 is greater than that in region 16 in FIG. 2.

The respective capacitances in connection with the FIGS. 1 and 2 model may be characterized as:

$$C = A \frac{\varepsilon_1 \varepsilon_2}{\varepsilon_1 t_2 + \varepsilon_2 t_1}$$

where:
C is the device capacitance
A is the area of electrode 14 exposed to material 18.
$\in_1$ is the permittivity of material 16 characterized by region 22.
$\in_2$ is the permittivity of material 18.
$t_1$ is the thickness of region 22.
$t_2$ is the thickness of material 18.

The different programmed states may be attained by application of respective suitable differential voltages relative to conductive capacitor electrodes 12 and 14, such as described in Strukov et al. "*The missing memristor found*", Nature Publishing Group, 1 May 2008, Vol. 453, pp. 80-83. For example, depending upon charge of the mobile dopants, suitable positive and/or negative voltages could be applied to conductive electrodes 12 and 14 to cause the mobile dopants to be attracted to or repelled from one of conductive electrodes 12 and 14, with the depicted example programming states of FIGS. 1 and 2 being retained after the programming voltage differential is removed.

Memcapacitor device 10 of FIG. 1 may be schematically modeled as a capacitor C1 and resistor R1 connected in parallel. Although barrier dielectric material 18 effectively prevents current from flowing between electrodes 12 and 14, barrier dielectric material 18 may conduct a very small and insignificant amount of leakage current. Resistor R1 represents this leakage current. Capacitor C1 represents the capacitance of memcapacitor device 10 in the FIG. 1 programmed state and represents the combined capacitance of material 16 and barrier dielectric material 18. Memcapacitor device 10 of FIG. 2 may also be schematically modeled as a capacitor C2 and resistor R2 connected in parallel. Resistor R2 represents the insignificant leakage current of memcapacitor device 10 in the FIG. 2 programmed state and which may be higher or lower than R1 of FIG. 1. Capacitor C2 represents the capacitance of memcapacitor device 10 in the FIG. 2 programmed state and which is larger than C1 of FIG. 1. C2 represents the combined capacitance of material 16 and barrier dielectric material 18.

Regardless, in one embodiment a memcapacitor device comprises a pair of opposing conductive electrodes, for example conductive electrodes 12 and 14. At least two materials are received between the opposing conductive electrodes. One of the materials comprises a crystalline semiconductive metal-containing mass that is overall stoichiometrically cation deficient to form mobile cation vacancies in a space lattice. In one embodiment, the crystalline semiconductive metal-containing mass is a crystalline semiconductive metal oxide mass. The other material is a barrier dielectric material that is in physical touching contact with the crystalline semiconductive metal-containing mass and that is impervious to movement of mobile cation vacancies from said mass into the barrier dielectric material. The semiconductive mass and the barrier dielectric material are of different composition relative one another which is at least characterized by at least one different atomic element. One of the semiconductive mass and the barrier dielectric material is closer to one of the pair of electrodes than is the other of the semiconductive mass and the barrier dielectric material. The other of the semiconductive mass and the barrier dielectric material is closer to the other of the pair of electrodes than is the one of the semiconductive mass and the barrier dielectric material. Example materials for the crystalline semiconductive metal-containing mass in this embodiment include those described above for material 16. Example materials for a barrier dielectric material in this embodiment include those described above for barrier dielectric material 18. Other attributes in this embodiment may include any one or combination of those described above with respect to the example embodiments described with reference to FIGS. 1 and 2.

An embodiment of the invention encompasses a method of programming a capacitor between different static programmable states characterized by different capacitance. Such may encompass using capacitors as described above, or using other capacitors. Regardless, an embodiment of such method comprises applying a voltage differential between two conductive capacitor electrodes to cause mobile dopants to move from a semiconductive mass received between the two conductive capacitor electrodes toward a mobile dopant barrier dielectric material received between the two conductive capacitor electrodes to increase capacitance of the capacitor from a lower capacitance state to a higher capacitance state. The semiconductive mass and the mobile dopant barrier dielectric material are of different composition relative one another which is at least characterized by at least one different atomic element. The mobile dopant barrier dielectric material inherently shields mobile dopants from moving into the mobile dopant barrier dielectric material by applying of the voltage. Example mobile dopants, semiconductive mass/material and mobile dopant dielectric materials may be as described above. FIGS. 1 and 2 depict an example of such programming in going from the state of FIG. 1 to that of FIG. 2. Such may be accomplished by applying suitable positive and/or negative voltages to capacitor electrodes 12 and 14 which cause the mobile dopants to migrate toward electrode 14 or away from electrode 12 thereby transforming the programmed FIG. 1 state to that of FIG. 2.

In one embodiment, a different voltage differential is subsequently applied between the two conductive capacitor electrodes to cause the mobile dopants to move away from the mobile dopant barrier dielectric material to reduce capacitance of the capacitor and thereby program the capacitor to one of said different static programmable states. Such may, for example, occur by programming the FIG. 2 state back to FIG. 1 by polarity reversal from that which produced FIG. 2 from FIG. 1, or by application of some other suitable differential voltage to achieve the stated reduced capacitance effect. Further, such subsequently applied voltage differential may or may not program the capacitor back to the immediately preceding capacitive state. Accordingly, programming to more than two capacitive states may selectively occur.

Figure 3:
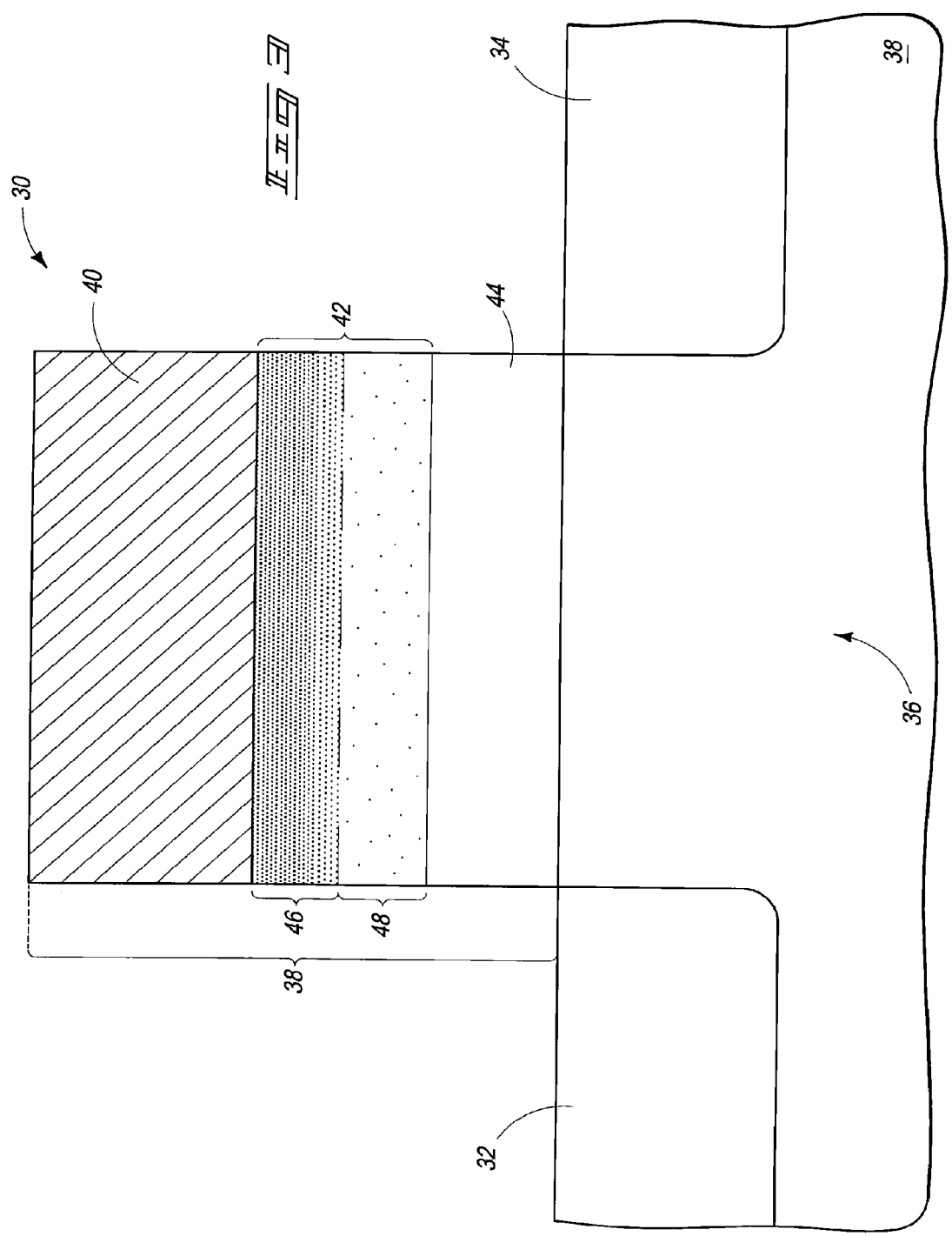
FIG. 3 is a diagrammatic sectional view of a field effect transistor device in one programmed state, and in accordance with an embodiment of the invention.
Figure 4:
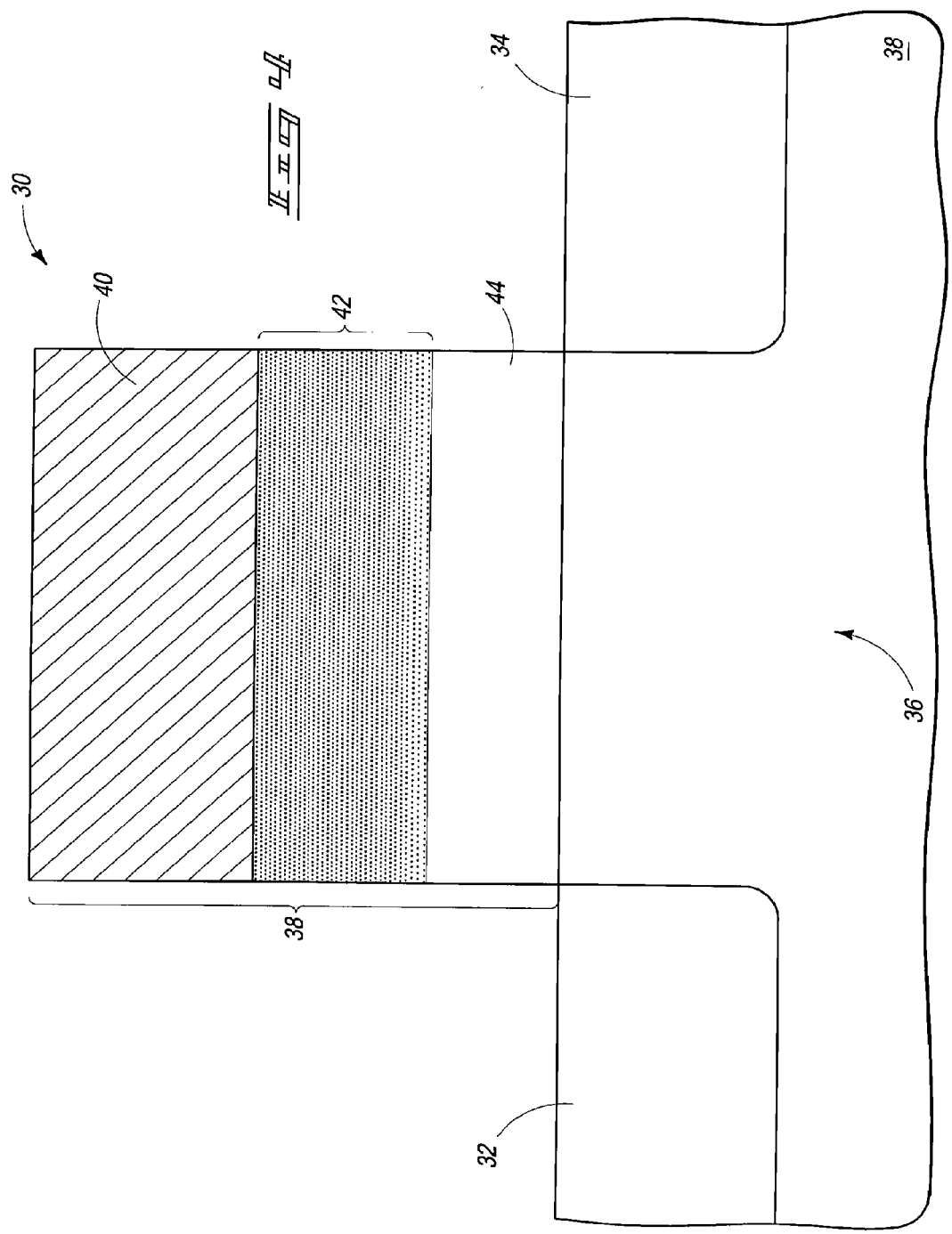
FIG. 4 is a view of the FIG. 3 field effect transistor device in another programmed state in accordance with an embodiment of the invention.

An embodiment of the invention encompasses a field effect transistor device which is capable of being repeatedly programmed to at least two different static threshold voltage states. Such is shown by way of example only in FIGS. 3 and 4 with respect to a field effect transistor device 30. FIG. 3 diagrammatically shows an example highest static threshold voltage state and FIG. 4 diagrammatically shows an example lowest static threshold voltage state.

Transistor device 30 comprises a pair of source/drain regions 32, 34, a channel region 36 received between a pair of source/drain regions 32, 34, and a gate construction 38 which is operably proximate channel region 36. Source/drain regions 32, 34 and channel region 36 are shown as being formed within a suitable semiconductive material 38, for example monocrystalline silicon. Material 38 would be suitably background doped at least in the region of channel 36 with at least a first or second conductivity type dopant such that a current path may be selectively created between source/drain regions 32, 34 by voltage applied to the gate. Source/drain regions 32, 34 are shown as being conductive diffusion regions which have been suitably doped with at least a conductivity enhancing dopant of opposite conductivity type to that of channel region 36. Halo, $L_{DD}$, or other regions, whether existing or yet-to-be developed, may be used with and/or as part of regions 32, 36, 34. Transistor device 30 is diagrammatically shown as being a planar or horizontal transistor. Any other configuration is contemplated whether existing or yet-to-be-developed, for example vertical, recessed, and FinFet whether fabricated in bulk, semiconductor-on-insulator, or other substrates whether existing or yet-to-be-developed.

Gate construction 38 comprises a conductive gate electrode 40. Gate construction 38 also comprises both a semiconductive material 42 comprising mobile dopants received within a dielectric and a mobile dopant barrier dielectric material 44, each of which is received between conductive gate electrode 40 and channel region 36. Mobile dopant barrier dielectric material 44 is closer to channel region 36 than to conductive gate electrode 40. Semiconductive material 42 is closer to conductive gate electrode 40 than to channel region 36. Semiconductive material 42 and barrier dielectric material 44 are of different composition relative one another that may or may not be at least characterized by at least one different atomic element.

Example materials for conductive gate electrode 40 are the same as that described above for electrodes 12 and 14. Example semiconductive materials 42, including properties and attributes, may be the same as that described above for semiconductive material 16 of memcapacitor device 10. Example mobile dopant barrier dielectric materials 44, including properties and attributes, are the same as those described above for mobile dopant barrier dielectric material 18 of memcapacitor device 10.

Regarding respective thicknesses, semiconductive material 42 and mobile dopant barrier dielectric material 44 may be of the same or different thickness. In one embodiment, mobile dopant barrier dielectric material 44 is no thicker than material 42. In one embodiment and as shown, material 42 is thicker than mobile dopant barrier dielectric material 44. In one example, material 42 has a thickness from 4 nanometers to 100 nanometers, and in one embodiment has a thickness no greater than 20 nanometers. In one embodiment, mobile dopant barrier dielectric material 44 has an equivalent oxide thickness from 1 nanometer to 12 nanometers, and in one embodiment has such a thickness no greater than 7 nanometers.

As a specific example transistor device 30, conductive gate electrode 40 consists essentially of elemental platinum having a thickness of 5 nanometers. Mobile dopant barrier dielectric material 44 is $ZrO_2$ having a thickness of 3 nanometers. Semiconductive material 42 is a combination of $TiO_2$ and $TiO_{2-x}$ and has as an overall thickness of 4 nanometers. In FIG. 3, region 48 has a thickness of 2 nanometers and is $TiO_2$ that has sufficiently less than $5 \times 10^{18}$ oxygen vacancies/cm³ which renders region 48 non-conductive. Region 46 has a thickness of 2 nanometers and an overall average oxygen vacancy density sufficiently greater than $5 \times 10^{18}$ vacancies/cm³ which renders region 46 conductive. In FIG. 4, region 42 may be considered as $TiO_{2-x}$ having an overall average oxygen vacancy density sufficiently greater than $5 \times 10^{18}$ vacancies/cm³ which is sufficient to render all of region 42 to be conductive. Overall average oxygen vacancy density in region 46 in FIG. 3 is greater than that in region 42 in FIG. 2.

The model respective threshold voltages in connection with the FIGS. 3 and 4 model may be characterized as:

$$V_T = V_{FB} + 2\varphi_B + \frac{\sqrt{q 2\varepsilon_s N_a 2\varphi_B}}{C}$$

C is gate area as F/m² where:
$V_T$ is device threshold voltage
$V_{FB}$ is flat band voltage
$\phi_B$ is potential difference of the channel fermi level and the intrinsic Fermi level divided by the elementary charge
q is elementary charge
$\varepsilon_s$ is permittivity of Silicon
$N_a$ is channel acceptor concentration
C is gate capacitance per unit area in F/m²
F is farads
m² is square meters Field effect transistor device 30 may be programmed into at least one of two different static threshold voltage states as shown in FIGS. 3 and 4 analogous to the programming with respect to the capacitance states of capacitor device 10 in FIGS. 1 and 2, respectively. For example in FIG. 3, a region 46 of semiconductive material 42 is analogous to the FIG. 1 region 20, and a region 48 of semiconductive material 42 is analogous to the FIG. 1 region 22. Likewise, the programming state depicted for the field effect transistor device 30 in FIG. 4 is analogous to the programming state of capacitor device 10 in FIG. 2, and which may be achieved for example as described below.

An embodiment of the invention encompasses a method of programming a field effect transistor device, for example device 30 or some other field effect transistor device. Regardless, such a method comprises applying a voltage differential between a channel region and a gate electrode to cause mobile dopants within a material received between the gate electrode and the channel region to move toward one of the gate electrode or the channel region to change a static threshold voltage of the field effect transistor device that is retained after said applied voltage differential is removed. In one embodiment, the applying of a voltage differential moves the mobile dopants toward the gate electrode and increases the threshold voltage of the transistor device. Such is shown or may be considered, for example, in programming the field effect transistor device of FIG. 4 to achieve the state of FIG. 3. In one embodiment, the applying of a voltage differential moves the mobile dopants toward the channel region and decreases the threshold voltage of the field effect transistor. For example with respect to device 30, such is exemplified by programming from the device state of FIG. 3 to that of FIG. 4.

Programming of field effect transistor device 30 to either of the states of FIGS. 3 and 4 may be performed in an analogous manner to that achieved with respect to FIGS. 1 and 2 for capacitor device 10. For example in programming transistor device 30, conductive gate electrode 40 may be used analogously to use of conductive electrode 12 in capacitor device 10 in FIGS. 1 and 2. Further, channel region 36 may be operated such that it functions analogously to use of conductive electrode 14 in capacitor device 10 in FIGS. 1 and 2. For example, channel region 36 may be provided to a suitable voltage potential the result of suitable selected current flow between source/drain regions 32, 34, or by direct application of a voltage to source/drain region 36 by suitable voltage application to material 38 outside of region 36. Further, multiple programmed threshold voltage states beyond two may be employed.

Figure 5:
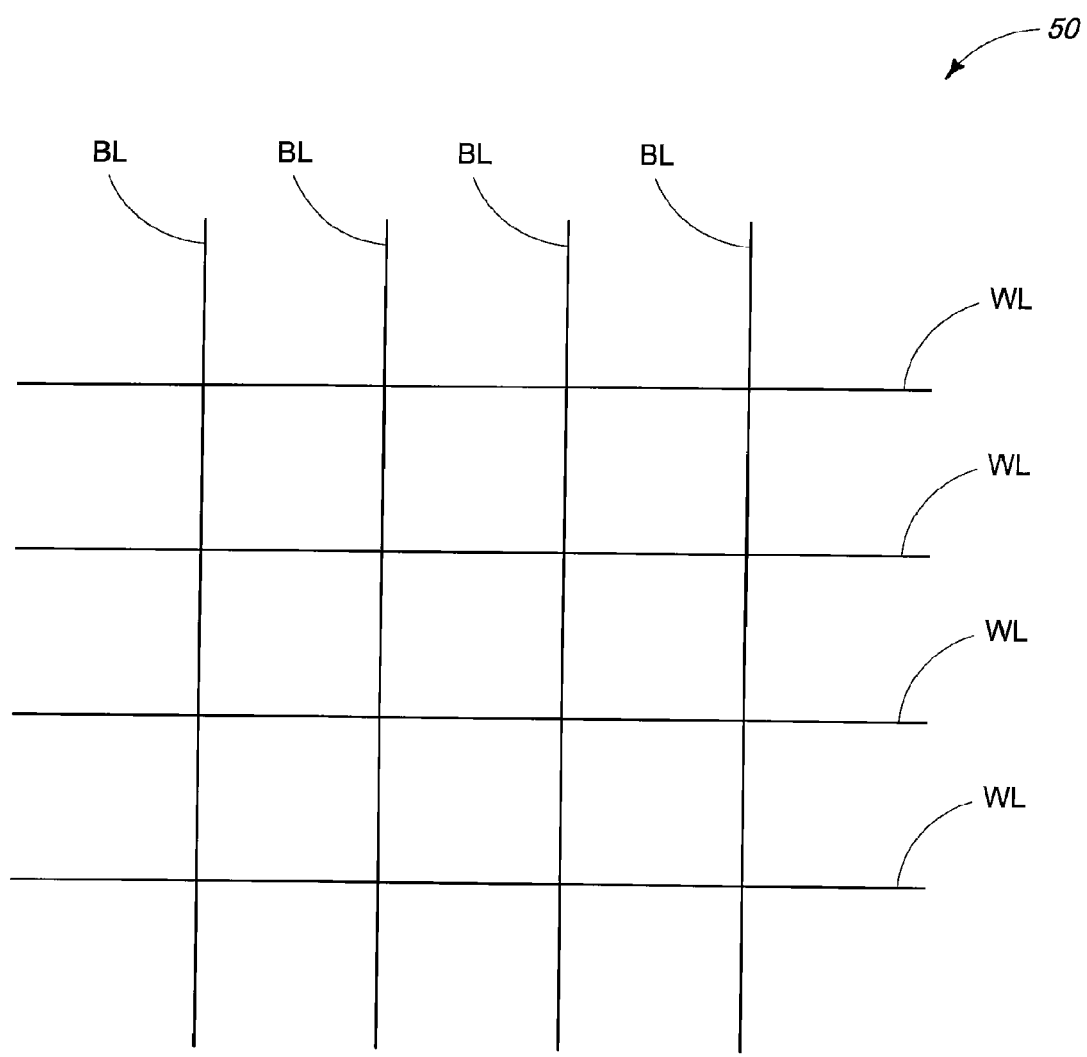
FIG. 5 is a diagrammatic top or schematic view of a non-volatile memory array in accordance with an embodiment of the invention.

Embodiments of the invention also encompass non-volatile memory arrays. Referring to FIG. 5, an example non-volatile memory array is indicated generally with reference numeral 50. Such comprises a plurality of word lines WL and a plurality of bit lines BL. Such are shown as being straight lines which orthogonally cross relative one another. Other shapes and angles of intersection, whether existing or yet-to-be developed, may be used. Bit lines BL and word lines WL are diagrammatically and schematically shown in FIG. 5 as touching one another where such intersect, although such would not be ohmically connected relative to the depicted intersections.

A plurality of memory cells, which are not specifically designated in FIG. 5, would be included in the non-volatile memory array of FIG. 50. Individual memory cells may be associated with each intersection of a bit line BL and a word line WL. Alternately by way of example, a single bit line may be associated with multiple memory cells with each having its own associated word line, for example corresponding in design to NAND flash. Regardless, individual memory cells of the non-volatile memory array will comprise a field effect transistor device capable of being reversibly programmed to at least two different static threshold voltage states. Such field effect transistor devices may comprise devices as described above in connection with FIGS. 3 and 4.

Figure 6:
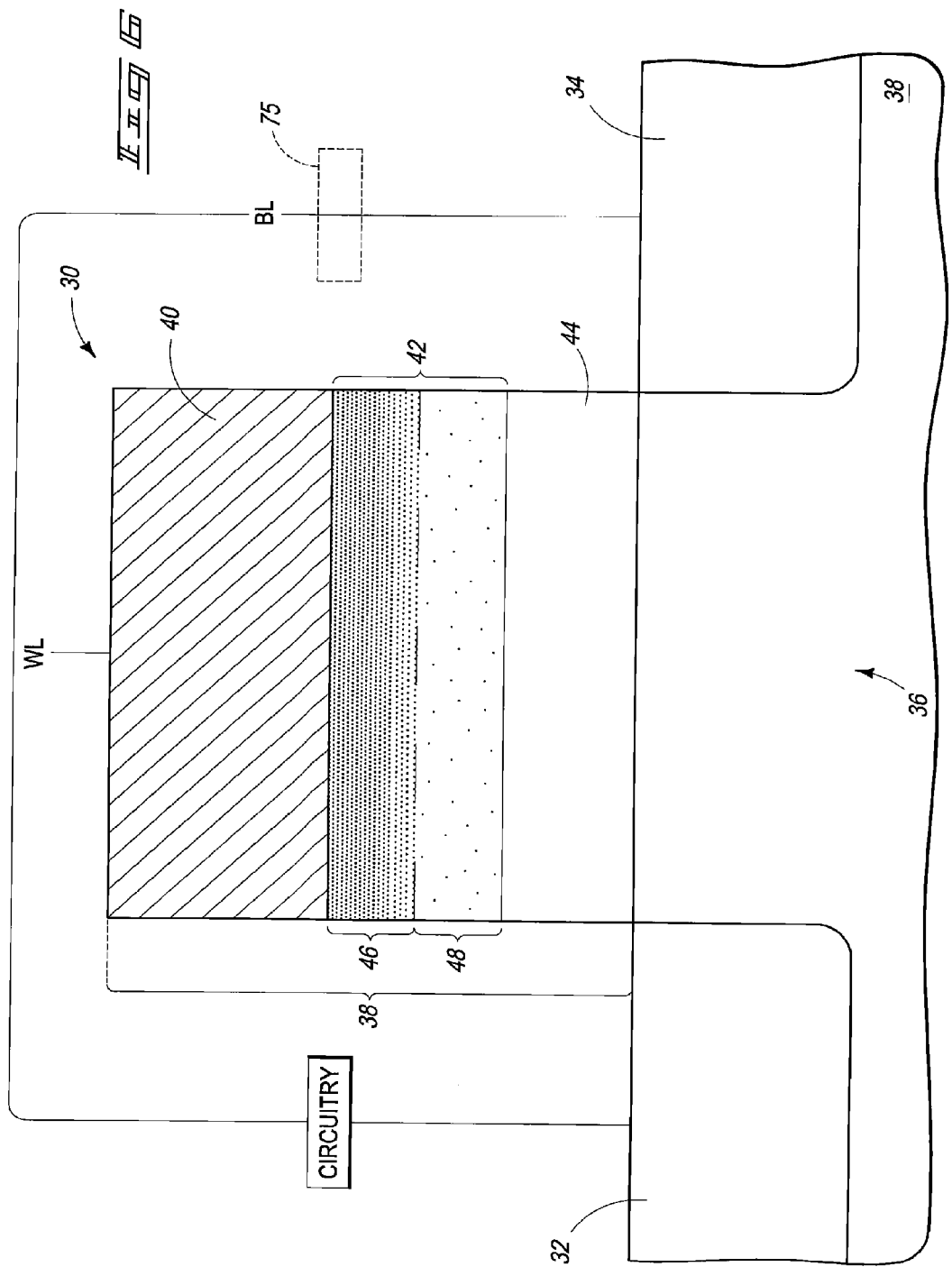
FIG. 6 is a diagrammatic sectional view of the FIG. 3 field effect transistor device associated in the FIG. 5 memory array in one programmed state and in accordance with an embodiment of the invention.
Figure 7:
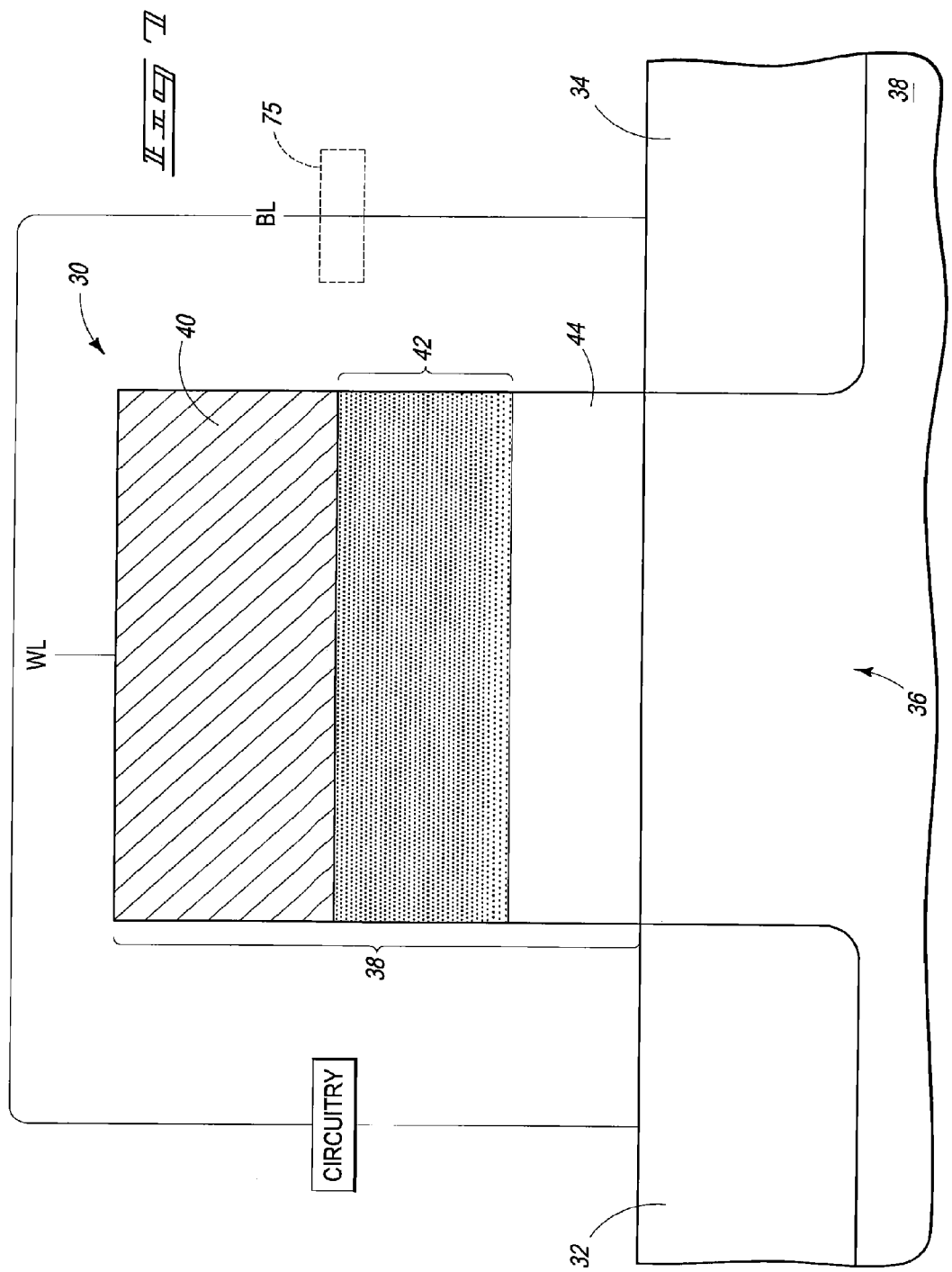
FIG. 7 is a view of the FIG. 6 field effect transistor device in another programmed state in accordance with an embodiment of the invention.

Specifically in an example, FIGS. 6 and 7 depict incorporation of field effect transistor device 30 in a non-volatile memory array such as that of FIG. 5, and correspond to the programming states of FIGS. 3 and 4, respectively. In an individual memory cell composed of device 30, conductive gate electrode 40 would connect with one of word lines WL from FIG. 5. One of the pair of source/drain regions 32 or 34 would connect with one of the bit lines BL, with source/drain region 34 in FIGS. 6 and 7 being shown as being so connected. A voltage potential may be applied to the opposing source/drain region (i.e., region 32) that is not connected with the one bit line for programming the individual memory cell, for example into either of the at least two respective programming states depicted by FIGS. 6 and 7. Suitable CIRCUITRY would be provided for reading the programmed state of each memory cell by sensing the programmed static threshold voltage state of the field effect transistor device of each memory cell.

In one embodiment and as shown in FIGS. 6 and 7, CIRCUITRY may be provided that is configured to enable a current to flow through the pair of source/drain regions 32, 34, the channel region 36, and the one of the bit lines BL to which source/drain region 34 connects when a voltage is applied to one of the word lines WL. In one embodiment, source/drain region 34 may indirectly connect with the one example bit line via one or more of the other memory cells. Such is diagrammatically shown in FIGS. 6 and 7 with respect to phantom depicted block 75 which is associated with one or more memory cells in addition to the one memory cell depicted in FIGS. 6 and 7. For example, indirect connection to a bit line may occur analogous to a single bit line being connected to a string of non-volatile charge-storage transistors in a NAND array of memory cells for example as shown in U.S. Pat. No. 7,476,588.

Regardless, in one example, a non-volatile memory array can be constructed by using field effect transistor devices as described herein wherein the gates are essentially programmable somewhat analogous to a flash transistor of a memory cell containing a flash transistor. For example, a floating body flash cell reversibly and statically retains data by shifting threshold voltage via charge-storage, wherein a memory cell incorporating a transistor as described herein is capable of storing reversible static data by varying the capacitance of the gate wherein the gate constitutes one electrode of a capacitor and the channel region the other electrode of the capacitor. Traditional flash transistors suffer from disturb issues as a result of stored charge in the form of free electrons being capable of easy ejection from the floating gates in which such are stored in one programmed state. Field effect transistor devices and non-volatile memory arrays incorporating such devices as described herein may be largely immune to any disturb issues as the mobile dopants would not be as readily ejectable, if at all, from the transistor as easily as free electrons are so ejectable in flash. Further, since stress-induced leakage current will accordingly not be as significant a concern for data retention in a memory cell as herein described, the example dielectric material 44 may be fabricated much thinner than the corresponding tunnel dielectric is fabricated in flash.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A field effect transistor device capable of being repeatedly programmed to at least two different static threshold voltage states, comprising:
a pair of source/drain regions, a channel region between the pair of source/drain regions, and a gate construction operably proximate the channel region; and
the gate construction comprising a conductive gate electrode and comprising a semiconductive material comprising mobile dopants within a dielectric and comprising a mobile dopant barrier dielectric material received between the conductive gate electrode and the channel region, the mobile dopant barrier dielectric material being closer to the channel region than to the conductive gate electrode, the semiconductive material that comprises mobile dopants within a dielectric being closer to the conductive gate electrode than to the channel region, the mobile dopant barrier dielectric material comprising at least one of $ZrO_2$, $SiO_2$, $Si_3N_4$, GeN, and $SrTiO_3$.

2. The device of claim 1 wherein the mobile dopant barrier dielectric material comprises $ZrO_2$.

3. The device of claim 1 wherein the mobile dopant barrier dielectric material comprises $SiO_2$.

4. The device of claim 1 wherein the mobile dopant barrier dielectric material comprises $Si_3N_4$.

5. The device of claim 1 wherein the mobile dopant barrier dielectric material comprises GeN.

6. The device of claim 1 wherein the mobile dopant barrier dielectric material comprises $SrTiO_3$.

7. A field effect transistor device capable of being repeatedly programmed to at least two different static threshold voltage states, comprising:
a pair of source/drain regions, a channel region between the pair of source/drain regions, and a gate construction operably proximate the channel region; and the gate construction comprising a conductive gate electrode and comprising a semiconductive material comprising mobile dopants within a dielectric and comprising a mobile dopant barrier dielectric material received between the conductive gate electrode and the channel region, the mobile dopant barrier dielectric material being closer to the channel region than to the conductive gate electrode, the semiconductive material that comprises mobile dopants within a dielectric being closer to the conductive gate electrode than to the channel region, the semiconductive material that comprises mobile dopants within a dielectric and the mobile dopant barrier dielectric material being in physical touching contact with one another.

8. The device of claim 7 wherein no other material is received between the pair of opposing conductive electrodes but for the semiconductive material that comprises mobile dopants within a dielectric and the mobile dopant barrier dielectric material.

9. A field effect transistor device capable of being repeatedly programmed to at least two different static threshold voltage states, comprising:
 a pair of source/drain regions, a channel region between the pair of source/drain regions, and a gate construction operably proximate the channel region; and
 the gate construction comprising a conductive gate electrode and comprising:
 a crystalline semiconductive metal-containing mass received between the conductive gate electrode and the channel region and that is overall stoichiometrically cation deficient to form mobile cation vacancies in a space lattice; and
 a barrier dielectric material received between the conductive gate electrode and the channel region and in physical touching contact with the crystalline semiconductive metal-containing mass and that is impervious to movement of the mobile cation vacancies from said mass into the barrier dielectric material, the semiconductive mass and the barrier dielectric material being of different composition relative one another which is at least characterized by at least one different atomic element, the barrier dielectric material being closer to the channel region than to the conductive gate electrode, the semiconductive mass being closer to the conductive gate electrode than to the channel region.

10. A field effect transistor device capable of being repeatedly programmed to at least two different static threshold voltage states, comprising:
 a pair of source/drain regions, a channel region between the pair of source/drain regions, and a gate construction operably proximate the channel region; and
 the gate construction comprising a conductive gate electrode and comprising:
 a crystalline semiconductive metal oxide mass received between the conductive gate electrode and the channel region and that is overall stoichiometrically oxygen atom deficient to form mobile oxygen vacancies in a space lattice; and
 a barrier dielectric material received between the conductive gate electrode and the channel region and in physical touching contact with the crystalline semiconductive metal oxide mass and that is impervious to movement of the mobile oxygen vacancies from said mass into the barrier dielectric material, the semiconductive mass and the barrier dielectric material being of different composition relative one another which is at least characterized by at least one different atomic element, the barrier dielectric material being closer to the channel region than to the conductive gate electrode, the semiconductive mass being closer to the conductive gate electrode than to the channel region.

11. The device of claim 10 wherein the barrier dielectric material comprises a metal oxide.

12. The device of claim 11 wherein a metal of the metal oxide of the barrier dielectric material is different from a metal of the metal oxide mass.

13. The device of claim 12 wherein the barrier dielectric material comprises $ZrO_2$ and the crystalline semiconductive metal oxide mass comprises a combination of $TiO_2$ and $TiO_{2-x}$.

14. The device of claim 10 wherein the barrier dielectric material consists essentially of stoichiometric metal oxide.

15. The device of claim 14 wherein a metal of the stoichiometric metal oxide is different from a metal of the metal oxide mass.

16. The device of claim 15 wherein the stoichiometric metal oxide comprises $ZrO_2$ and the crystalline semiconductive metal oxide mass comprises a combination of $TiO_2$ and $TiO_{2-x}$ in at least one programmed state.

17. The method of claim 16 wherein the stoichiometric metal oxide consists essentially of $ZrO_2$.

* * * * *